(12) United States Patent
Fang

(10) Patent No.: US 11,832,505 B2
(45) Date of Patent: Nov. 28, 2023

(54) PERFORATED DISPLAY SCREEN, METHOD OF MANUFACTURING SAME, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Hong Fang, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 453 days.

(21) Appl. No.: 17/251,792

(22) PCT Filed: Sep. 4, 2020

(86) PCT No.: PCT/CN2020/113540
§ 371 (c)(1),
(2) Date: Dec. 12, 2020

(87) PCT Pub. No.: WO2022/032767
PCT Pub. Date: Feb. 17, 2022

(65) Prior Publication Data
US 2022/0052281 A1  Feb. 17, 2022

(30) Foreign Application Priority Data
Aug. 13, 2020 (CN) .......... 202010810300.1

(51) Int. Cl.
*H10K 77/10* (2023.01)
*H01L 27/146* (2006.01)
(Continued)

(52) U.S. Cl.
CPC ...... *H10K 77/111* (2023.02); *H01L 27/14623* (2013.01); *H10K 50/841* (2023.02);
(Continued)

(58) Field of Classification Search
None
See application file for complete search history.

(56) References Cited

U.S. PATENT DOCUMENTS

| 11,258,040 B2* | 2/2022 | Won .................. H10K 71/00 |
| 2020/0127231 A1 | 4/2020 | Yun et al. |

(Continued)

FOREIGN PATENT DOCUMENTS

| CN | 110233167 A | 9/2019 |
| CN | 111384141 A | 7/2020 |
| KR | 20200073549 A | 6/2020 |

OTHER PUBLICATIONS

International Search Report in International application No. PCT/CN2020/113540, dated May 12, 2021.

*Primary Examiner* — J.E. Schoenholtz
(74) *Attorney, Agent, or Firm* — PV IP PC; Wei Te Chung; Zhigang Ma

(57) ABSTRACT

A pixel driving circuit and a display panel are provided. The pixel driving circuit includes a control unit to output a control signal by detecting a voltage difference between two opposite ends of a sampling resistor, and to turn on a fourth switch by the control signal. When the fourth switch is turned on, a second positive voltage received by the pixel driving circuit charges a second node to further speed up a voltage pulling up of the second node to improve a detecting speed of the pixel driving circuit.

14 Claims, 4 Drawing Sheets

(51) Int. Cl.
| | |
|---|---|
| *H10K 50/84* | (2023.01) |
| *H10K 59/12* | (2023.01) |
| *H10K 59/40* | (2023.01) |
| *H10K 59/65* | (2023.01) |
| *H10K 71/00* | (2023.01) |
| *H10K 102/00* | (2023.01) |
| *H10K 50/844* | (2023.01) |

(52) U.S. Cl.
CPC ........... *H10K 50/844* (2023.02); *H10K 59/12* (2023.02); *H10K 59/40* (2023.02); *H10K 59/65* (2023.02); *H10K 71/00* (2023.02); *H10K 59/1201* (2023.02); *H10K 2102/311* (2023.02)

(56) References Cited

U.S. PATENT DOCUMENTS

2020/0328375 A1* 10/2020 Won .................. H10K 71/00
2021/0286218 A1* 9/2021 Yu ...................... C09B 3/14

* cited by examiner

PERFORATED DISPLAY SCREEN, METHOD OF MANUFACTURING SAME, AND DISPLAY DEVICE

RELATED APPLICATIONS

This application is a Notional Phase of PCT Patent Application No. PCT/CN2020/113540 having international filing date of Sep. 4, 2020, which claims the benefit of priority of Chinese Patent Application No. 202010810300.1 filed on Aug. 13, 2020. The contents of the above applications are all incorporated by reference as if fully set forth herein in their entirety.

FIELD

The present disclosure relates to display technologies, and more particularly, to a perforated display screen, a method of manufacturing the same, and a display device.

BACKGROUND

At present, a full screen of a flexible OLED (organic light emitting display) on a market has gradually become a mainstream in a high-end mobile phone market. At this stage, there is always a shortcoming of self-luminous OLED products, that part of scattered light of the OLED can be transmitted laterally through a film layer above a luminescent material, resulting in a problem of light leakage on a side of a screen. As the screen-to-body ratio continues to increase, perforated screens have been widely used in OLED products. The perforated screen is realized by perforating the screen, but a hole region will also cause light leakage like the side of the screen. The light leakage will interfere with collection of external light when a camera is taking pictures and affect a shooting effect.

The above traditional technology has at least the following problems: the perforated screen has light leakage from the side of the screen, which greatly interferes with the shooting effect of the camera.

SUMMARY

In view of the above, the present disclosure provides a perforated display screen, a method of manufacturing the same, and a display device to resolve issues of light leakage from the side of the screen, which greatly interferes with the shooting effect of the camera.

In order to achieve above-mentioned object of the present disclosure, one embodiment of the disclosure provides a perforated display screen, including:
  a base substrate provided with a first hole region;
  an array substrate layer disposed on the base substrate and provided with a second hole region;
  an encapsulation layer disposed on the array substrate layer and provided with a third hole region;
  a touch layer disposed on the encapsulation layer and provided with a fourth hole region, wherein the first hole region, the second hole region, the third hole region, and the fourth hole region are stacked in sequence, and the fourth hole region, the third hole region, and the second hole region are perforated in sequence; and
  a black photoresist unit covering a surface of a hole wall of the second hole region, a surface of a hole wall of the third hole region, and a surface of a hole wall of the fourth hole region, and opining to the first hole region to form a perforation.

Another embodiment of the disclosure further provides a method of manufacturing a perforated display screen, including steps of:
  providing a base substrate, and providing an array substrate layer on the base substrate, wherein the base substrate is provided with a first hole region, and the array substrate layer is provided with a second hole region;
  providing an encapsulation layer on the array substrate layer, wherein the encapsulation layer is provided with a third hole region;
  providing a touch layer on the encapsulation layer, wherein the touch layer is provided with a fourth hole region, and the first hole region, the second hole region, the third hole region, and the fourth hole region are stacked in sequence;
  etching the fourth hole region, the third hole region, and the second hole region in sequence;
  providing a black photoresist unit to cover a surface of a hole wall of the second hole region, a surface of a hole wall of the third hole region, and a surface of a hole wall of the fourth hole region; and
  perforating the first hole region to form a perforation.

Another embodiment of the disclosure further provides a display device, including a perforated display screen,
  wherein the perforated display screen includes:
  a base substrate provided with a first hole region;
  an array substrate layer disposed on the base substrate and provided with a second hole region;
  an encapsulation layer disposed on the array substrate layer and provided with a third hole region;
  a touch layer disposed on the encapsulation layer and provided with a fourth hole region, wherein the first hole region, the second hole region, the third hole region, and the fourth hole region are stacked in sequence, and the fourth hole region, the third hole region, and the second hole region are perforated in sequence; and
  a black photoresist unit covering a surface of a hole wall of the second hole region, a surface of a hole wall of the third hole region, and a surface of a hole wall of the fourth hole region, and opining to the first hole region to form a perforation.

In comparison with prior art, the disclosure provides the perforated display screen includes the base substrate, the array substrate layer, the encapsulation layer, the touch layer, and the black photoresist unit. The base substrate is provided with a first hole region. The array substrate layer is disposed on the base substrate and provided with a second hole region. The encapsulation layer disposed on the array substrate layer and provided with a third hole region. The touch layer disposed on the encapsulation layer and provided with a fourth hole region. The first hole region, the second hole region, the third hole region, and the fourth hole region are stacked in sequence. The fourth hole region, the third hole region, and the second hole region are perforated in sequence. The black photoresist unit covers a surface of a hole wall of the second hole region, a surface of a hole wall of the third hole region, and a surface of a hole wall of the fourth hole region, and is opining to the first hole region to form a perforation. The disclosure provides the touch layer directly disposed on the array substrate layer to reduce a film thickness above a light emitting layer and then to reduce amount of light leakage after perforating. The disclosure etching an inorganic film layers of the second hole region, the third hole region, and the fourth hole region before perforating the first hole region of the base substrate to reduce stress to a great degree, an anti-cracking design of a hole region can be omitted to further reduce a diameter of a hole. The disclosure provides the black photoresist unit to cover a surface of a hole wall of the second hole region, a surface of a hole wall of the third hole region, and a surface of a hole wall of the fourth hole region to directly block lateral light leakage of the hole region (the second hole region, the third hole region, and the fourth hole region) to reduce interference of the light leakage of the hole region with the camera.

DETAILED DESCRIPTION

Figure 1:
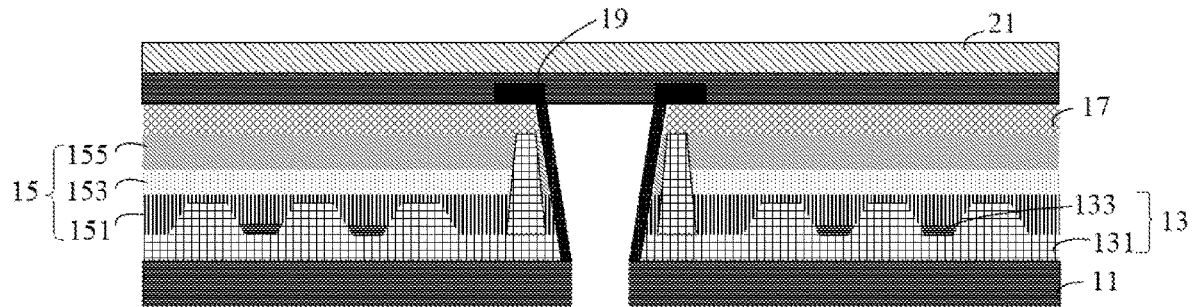
FIG. 1 is a schematic view of structure of a perforated display screen according to an embodiment of the present disclosure.

The technical solutions in the embodiments of the present application will be described clearly and completely in conjunction with the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

In the description of this application, it should be noted that, unless otherwise clearly specified and limited, the terms "installation", "connection", and "connection" should be understood in a broad sense, for example, it can be fixed connection or detachable connected, or integrally connected; may be mechanical, electrical, or may communicate with each other; may be directly connected, or may be indirectly connected through an intermediary, may be the connection between two elements or the interaction of two elements relationship. Those of ordinary skill in the art can understand the specific meanings of the above terms in this application according to specific situations. In this embodiment, the analog display screen touch unit is connected to the head tracking unit and is used to obtain a movement path of the sensitive cursor in the display device.

The following disclosure provides many different implementations or examples for implementing different structures of the present application. In order to simplify the disclosure of the present application, the components and settings of specific examples are described below. Of course, they are only examples, and the purpose is not to limit this application. In addition, the present application may repeat reference numerals and/or reference letters in different examples. Such repetition is for the purpose of simplicity and clarity and does not itself indicate the relationship between the various embodiments and/or settings discussed. In addition, the present application provides examples of various specific processes and materials, but those of ordinary skill in the art may be aware of the application of other processes and/or the use of other materials.

Referring to FIG. 1, one embodiment of the disclosure provides a perforated display screen, including:

a base substrate 11 provided with a first hole region;

an array substrate layer 13 disposed on the base substrate 11 and provided with a second hole region;

an encapsulation layer 15 disposed on the array substrate layer 13 and provided with a third hole region;

a touch layer 17 disposed on the encapsulation layer 15 and provided with a fourth hole region, wherein the first hole region, the second hole region, the third hole region, and the fourth hole region are stacked in sequence, and the fourth hole region, the third hole region, and the second hole region are perforated in sequence; and a black photoresist unit 19 covering a surface of a hole wall of the second hole region, a surface of a hole wall of the third hole region, and a surface of a hole wall of the fourth hole region, and opining to the first hole region to form a perforation.

In detail, the base substrate 11 includes flexible substrate and a PI layer covering the flexible substrate. The PI layer is a thin film layer made of polyimide material. The array substrate layer 13 includes an array substrate and a light emitting layer disposed on the array substrate. The first hole region is a region to be perforated on the base substrate. The second hole region is a region to be perforated on the array substrate layer. In an embodiment, a size of the first hole region is less than or equal to a size of the second hole region.

The encapsulation layer 15 is a thin film encapsulation layer. The encapsulation layer 15 is configured to prevent from moisture and oxygen to reach the array substrate layer 13. The third hole region is a region to be perforated on the encapsulation layer 15. In one embodiment, a size of the third hole region is greater than or equal to a size of the second hole region. A touch layer (touch panel) 17 is a touch layer provided by a touch technology. The fourth hole region is a region to be perforated on the touch layer. In one embodiment, a size of the fourth hole region is greater than or equal to a size of the third hole region. A material of the black photoresist unit 19 is a black organic photoresist and/or black high precision positive photoresist.

The second hole region, the third hole region, and the fourth hole region are the hole regions with a same shape. Axes of the second hole region, the third hole region, and the fourth hole region are over lapped. For example, shapes of the second hole region, the third hole region, and the fourth hole region are circles.

In one embodiment, a layer of polyimide can be deposited on the base substrate to form a polyimide thin film layer (PI layer). For example, the PI layer includes a single layer, double layers, or multi-layers of the polyimide thin film layer.

In one embodiment, the array substrate includes a substrate and metal traces disposed on the substrate.

In detail, a first hole region is provided on the base substrate 11. A second hole region is provided on the array substrate layer 13. The array substrate layer 13 is formed on the base substrate 11 to make the first hole region corresponding to and contact with the second hole region. A third hole region is provided on the array substrate layer 13. An encapsulation layer 15 is provided on the array substrate layer 13 by encapsulation technologies. The third hole region is corresponding to and contact with the second hole region. A touch layer 17 is provided on the encapsulation layer 15 by touch technologies. The touch layer 17 is provided with a fourth hole region. The fourth hole region is corresponding to and contact with the third hole region.

The fourth hole region of the touch layer 17, the third hole region of the encapsulation layer 15, and the second hole region of the array substrate layer 13 are etching to form holes in sequence by etching technology. An inorganic material of the fourth hole region, an inorganic material of the third hole region, and an inorganic material of the second hole region are removed respectively by etching until reaching the PI layer of the first hole region.

Further, after etching, a surface of a hole wall of the second hole region, a surface of a hole wall of the third hole region, and a surface of a hole wall of the fourth hole region are covered by a black photoresist unit 19. The black photoresist unit 19 covers the surface of the hole wall and traces of the second hole region after etching, covers the surface of the hole wall and traces of the third hole region after etching, and covers the surface of the hole wall and traces of the fourth hole region after etching to block light from the traces and hole walls of the hole regions (the second hole region, the third hole region, and the fourth hole region) and block lateral light leakage of the hole regions.

The black photoresist unit 19 is patterning by photo mask. A thickness of the black photoresist unit 19 is very small and occupied rare area of the hole regions. Utilization of aperture can be maximized, and the aperture can be narrower to increase a screen-to-body ratio. A border of the hole region is minimized, and the aperture is minimized.

Further, after etching the second hole region, the third hole region, and the fourth region, and covering the black photoresist unit 19, the first hole region is perforated to form a perforation. A stress when perforating the first hole region can reduce to a great degree. An anti-cracking design of the hole region can be omitted to further reduce a diameter of the aperture. A perforating process of the perforated display screen is done.

The disclosure provides the touch layer directly disposed on the array substrate layer to reduce a film thickness above a light emitting layer and then to reduce amount of light leakage after perforating. The disclosure etching an inorganic film layers of the second hole region, the third hole region, and the fourth hole region before perforating the first hole region of the base substrate to reduce stress to a great degree, an anti-cracking design of a hole region can be omitted to further reduce a diameter of a hole. The disclosure provides the black photoresist unit to cover a surface of a hole wall of the second hole region, a surface of a hole wall of the third hole region, and a surface of a hole wall of the fourth hole region to directly block lateral light leakage of the hole region (the second hole region, the third hole region, and the fourth hole region) to reduce interference of the light leakage of the hole region with the camera.

Referring to FIG. 1, in one embodiment, the perforated display screen further includes a glass cover layer 21. The glass cover layer 21 is disposed on the touch layer 17 after the touch layer 17 covered by the black photoresist unit 19.

The glass cover layer 21 is referring to a glass cover layer.

In detail, the touch layer 17 can attach the glass cover layer 21 after the touch layer 17 covered the black photoresist unit 19.

In one embodiment, the glass cover layer 21 is attached on the black photoresist unit 19 and the touch layer 17 by an optical clear adhesive.

In detail, the disclosure provides the array substrate layer 13 on the base substrate 11, provides the encapsulation layer 15 and the touch layer 17 on the array substrate layer 13 in sequence to reduce a film thickness above the array substrate layer 13 and then to reduce amount of light leakage after perforating. The disclosure etching the inorganic film layers of the second hole region, the third hole region, and the fourth hole region before perforating the first hole region of the base substrate 11 to reduce stress when perforating the first hole region to a great degree, an anti-cracking design of a hole region can be omitted to further reduce a diameter of the aperture. The disclosure provides the black photoresist unit to cover the hole walls of the hole regions (the second hole region, the third hole region, and the fourth hole region) with pattern after the inorganic layer of the second hole region, the third hole region, and the fourth hole region to directly block lateral light leakage of the hole regions to reduce interference of the light leakage of the hole regions with the camera. A thickness of the black photoresist unit 19 is very small and occupied rare area of the hole regions. Utilization of aperture can be maximized, and the aperture can be narrower to increase a screen-to-body ratio. A border of the hole region needs no black glue to block light when attaching the glass cover layer 21. The border of the hole region is minimized, and the aperture is minimized.

In an embodiment, as shown in FIG. 1, the array substrate layer 13 includes an array substrate 131 and a light-emitting material layer 133. The array substrate 131 is disposed on the base substrate 11, and the light-emitting material layer 133 is disposed on the array substrate 131.

Wherein, the array substrate 131 includes a lining substrate. The lining substrate may be a flexible substrate. A material of the lining substrate is a transparent insulating material, such as glass, plastic, or ceramic material. The lining substrate may be a plastic substrate, such as, for example, polyimide, polyethylene terephthalate, polyester, polycarbonates, polyacrylates, or polystyrene. A material of the light-emitting material layer 133 may be an OLED material.

In detail, the array substrate 131 is provided on the base substrate 11. An OLED material is evaporating to coat on the array substrate 131 to form the light-emitting material layer 133 on the array substrate 131. The array substrate 131 and the light-emitting material layer 133 combine to form the array substrate layer 13.

In an embodiment, a thickness of the black photoresist unit 19 ranges from 1.5 microns to 5 microns.

In detail, the thickness of a black photoresist ranges from 1.5 microns to 5 microns. The black photoresist unit 19 has a function of isolating moisture and oxygen. A material of the black photoresist unit 19 can be a polymer material such as a polyimide, etc.

In an embodiment, the encapsulation layer 15 includes a first thin film layer 151 disposed on the array substrate layer 13, an organic layer 153 disposed on the first thin film layer 151, and a second thin film layer 155 disposed on the organic layer 153.

The first thin film layer 151 refers to a thin film layer formed by chemical reactions on a surface of a substrate using one or several gas phase compounds or substances containing thin film elements. The second thin film layer 155 refers to a thin film layer formed by chemical reactions on a surface of a substrate using one or several gas phase compounds or substances containing thin film elements.

In detail, the first thin film layer 151 is deposited on the array substrate layer 13 by chemical vapor deposition. The organic layer 153 is form on the first thin film layer 151 by ink jet printing. The second thin film layer 155 is deposited on the organic layer 153 by chemical vapor deposition. The first thin film layer 151, the organic layer 153, and the second thin film layer 155 combine to form the encapsulation layer 15.

Further, a touch layer 17 may be form directly on the encapsulation layer 15 to reduce a film width and then to reduce amount of light leakage after perforating.

Figure 2:
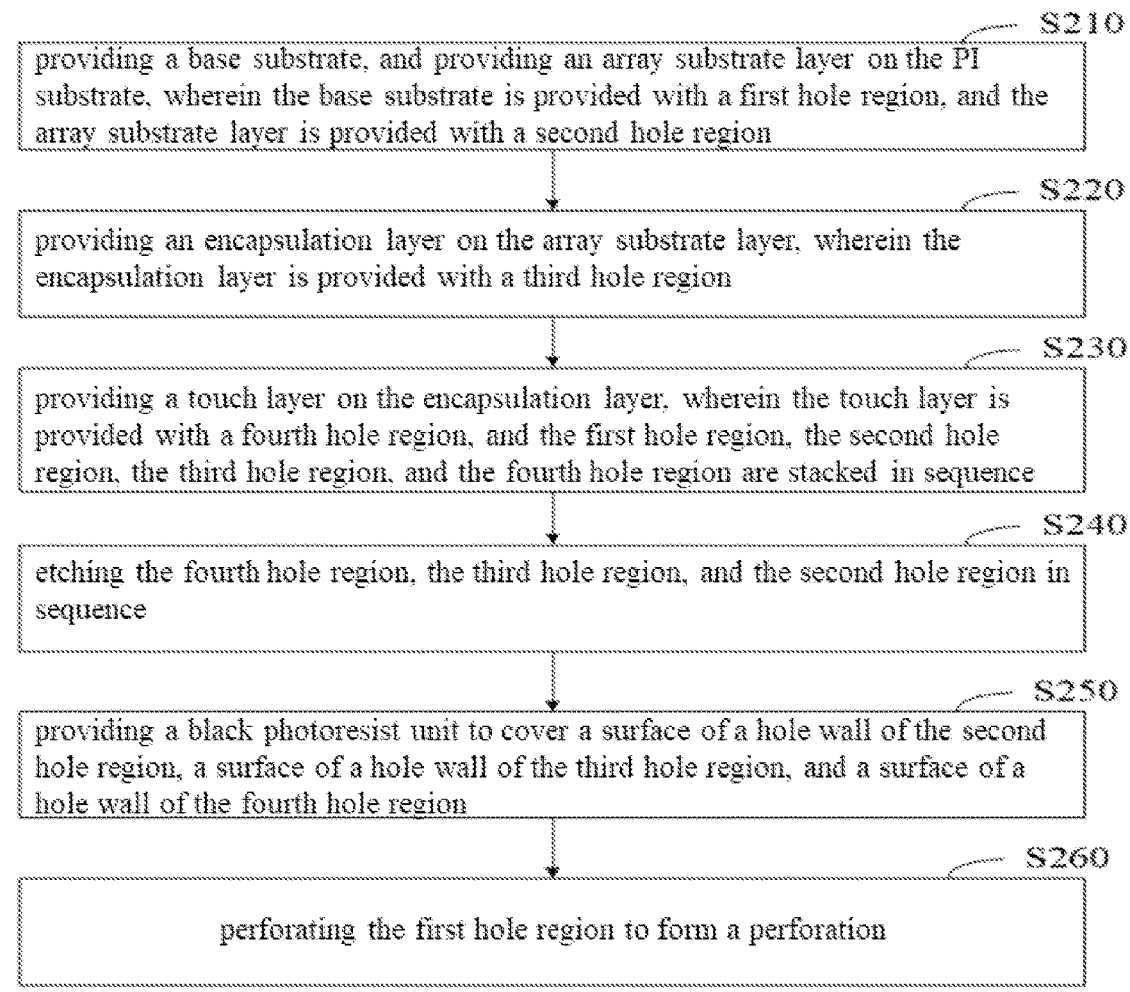
FIG. 2 is a schematic view of a first process of a method of manufacturing a perforation of a perforated display screen according to an embodiment of the present disclosure.

In an embodiment, as shown in FIG. 2, the disclosure providing a method of manufacturing a perforated display screen. The following description is based on the manufacturing method applying on the schematic structure of the perforated display screen in the FIG. 1. The method of manufacturing the perforated display screen includes steps of:

At step S210: providing a PI (polyimide film) substrate 11 and providing an array substrate layer 13 on the base substrate 11. The base substrate 11 is provided with a first hole region, and the array substrate layer 13 is provided with a second hole region.

The base substrate 11 includes flexible substrate and a PI layer covering the flexible substrate. The PI layer is a thin film layer made of polyimide material. The array substrate layer 13 includes an array substrate and a light emitting layer disposed on the array substrate. The first hole region is a region to be perforated on the base substrate. The second hole region is a region to be perforated on the array substrate layer. In an embodiment, a size of the first hole region is less than or equal to a size of the second hole region.

In one embodiment, a layer of polyimide can be deposited on the base substrate to form a polyimide thin film layer (PI layer). For example, the PI layer includes a single layer, double layers, or multi-layers of the polyimide thin film layer.

In one embodiment, the array substate includes a substrate and metal traces disposed on the substrate.

In detail, a first hole region is provided on the base substrate 11. A second hole region is provided on the array substrate layer 13. The array substrate layer 13 is formed on the base substrate 11 to make the first hole region corresponding to and contact with the second hole region.

At step S220, providing an encapsulation layer 15 on the array substrate layer 13, wherein the encapsulation layer 15 is provided with a third hole region.

The encapsulation layer 15 is a thin film encapsulation layer. The encapsulation layer 15 is configured to prevent from moisture and oxygen to reach the array substrate layer 13. The third hole region is a region to be perforated on the encapsulation layer 15. In one embodiment, a size of the third hole region is greater than or equal to a size of the second hole region.

In detail, a third hole region is provided on the array substrate layer 13. An encapsulation layer 15 is provided on the array substrate layer 13 by encapsulation technologies. The third hole region is corresponding to and contact with the second hole region.

At step S230: providing a touch layer 17 on the encapsulation layer 15, wherein the touch layer 17 is provided with a fourth hole region, and the first hole region, the second hole region, the third hole region, and the fourth hole region are stacked in sequence.

A touch layer 17 is provided on the encapsulation layer 15 by touch technologies. The fourth hole region is a region to be perforated on the touch layer. In one embodiment, a size of the fourth hole region is greater than or equal to a size of the third hole region.

In detail, the touch layer 17 is provided on the encapsulation layer 15 by the touch technologies. The touch layer 17 is defined with a fourth hole region. The fourth hole region is corresponding to and contact with the third hole region.

At step S240: etching the second hole region, the third hole region, and the fourth hole region in sequence.

The second hole region, the third hole region, and the fourth hole region are the hole regions with a same shape. Axes of the second hole region, the third hole region, and the fourth hole region are over lapped. For example, shapes of the second hole region, the third hole region, and the fourth hole region are circles.

The fourth hole region of the touch layer 17, the third hole region of the encapsulation layer 15, and the second hole region of the array substrate layer 13 are etching to form holes in sequence by etching technology. An inorganic material of the fourth hole region, an inorganic material of the third hole region, and an inorganic material of the second hole region are removed respectively by etching until reaching the PI layer of the first hole region.

At S250: providing a black photoresist unit 19 to cover a surface of a hole wall of the second hole region, a surface of a hole wall of the third hole region, and a surface of a hole wall of the fourth hole region after etching.

A material of the black photoresist unit 19 is a black organic photoresist and/or black high precision positive photoresist.

After etching, a surface of a hole wall of the second hole region, a surface of a hole wall of the third hole region, and a surface of a hole wall of the fourth hole region are covered by a black photoresist unit 19 so that the black photoresist unit 19 covers the surface of the hole wall and traces of the second hole region after etching, covers the surface of the hole wall and traces of the third hole region after etching, and covers the surface of the hole wall and traces of the fourth hole region after etching to block light from the traces and hole walls of the hole regions (the second hole region, the third hole region, and the fourth hole region) and block lateral light leakage of the hole regions.

The black photoresist unit 19 is patterning by photo mask. A thickness of the black photoresist unit 19 is very small and occupied rare area of the hole regions. Utilization of aperture can be maximized, and the aperture can be narrower to increase a screen-to-body ratio. A border of the hole region is minimized, and the aperture is minimized.

At step S260: perforating the first hole region to form a perforation.

In detail, after etching the second hole region, the third hole region, and the fourth region, and covering the black photoresist unit 19, the first hole region is perforated to form a perforation. A stress when perforating the first hole region can reduce to a great degree. An anti-cracking design of the hole region can be omitted to further reduce a diameter of the aperture. A perforating process of the perforated display screen is done.

The disclosure provides a TP (touch panel) directly disposed on the array substrate layer 13 to reduce a film thickness above a light emitting layer and then to reduce amount of light leakage after perforating. The disclosure etching an inorganic film layers of the second hole region, the third hole region, and the fourth hole region before perforating the first hole region of the PI layer 11 to reduce stress to a great degree, an anti-cracking design of a hole region can be omitted to further reduce a diameter of a hole. The disclosure provides the black photoresist unit 19 to cover a surface of a hole wall of the second hole region, a surface of a hole wall of the third hole region, and a surface of a hole wall of the fourth hole region to directly block lateral light leakage of the hole region (the second hole region, the third hole region, and the fourth hole region) to reduce interference of the light leakage of the hole region with the camera.

In an embodiment, the step of etching the fourth hole region, the third hole region, and the second hole region in sequence further includes:

etching the fourth hole region, the third hole region, and the second hole region in sequence by photolithography and dry etching.

In detail, the fourth hole region is performed with a photolithograph process and then performed with a dry etching process. After parts of the fourth hole region is removing, the third hole region is performed with a photolithograph process and then performed with a dry etching process. After parts of the third hole region is removing, the second hole region is performed with a photolithograph process and then performed with a dry etching process. A removing by etching of the second hole region, the third hole region, and the fourth hole region is done.

Figure 3:
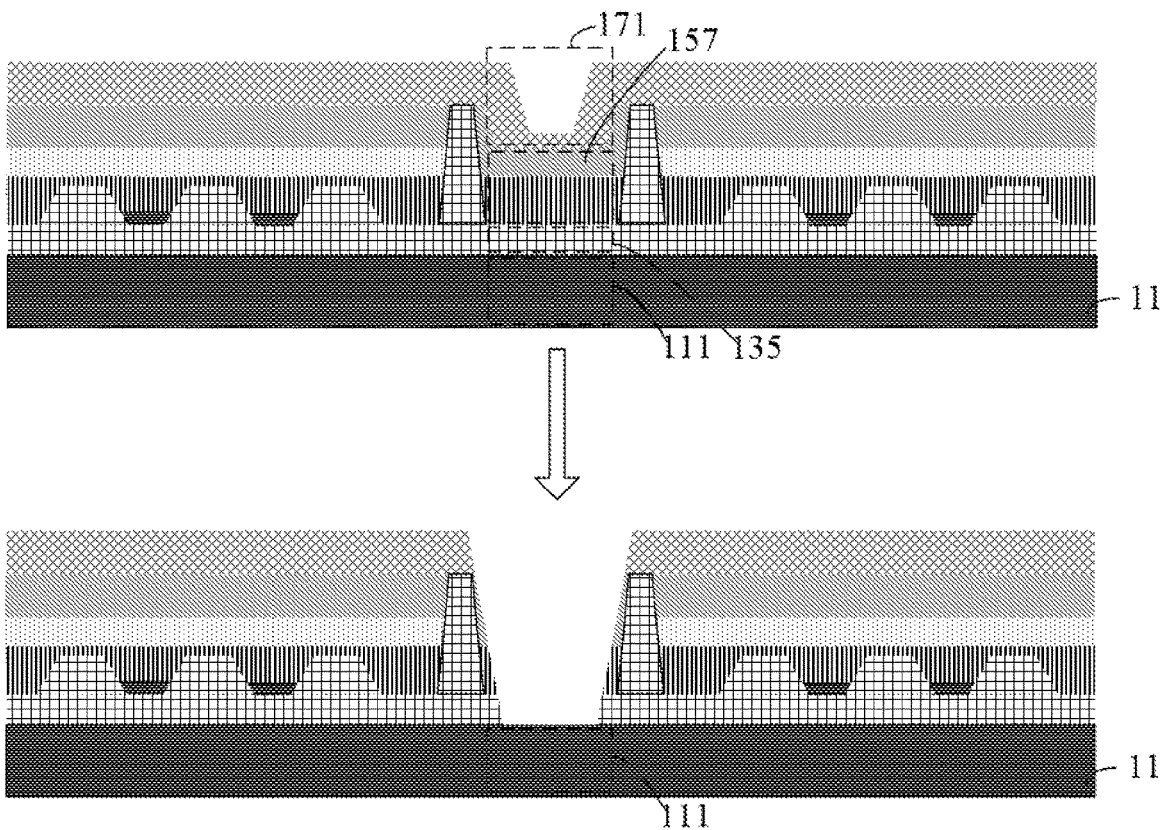
FIG. 3 is a technical schematic view of an etching process according to an embodiment of the present disclosure.

Further, as shown in FIG. 3, a technical schematic view of an etching process, the etching process includes steps of:

The fourth hole region 171, the third hole region 157, and the second hole region 135 are undergoing a photolithograph etching process and dry etching process in sequence by photolithography technology and etching technology to remove the inorganic materials of the fourth hole region 171, the third hole region 157, and the second hole region 135 are removed respectively until reaching the PI layer 11 of the first hole region. The first hole region 111 of the PI layer 11 is left.

In an embodiment, the step of providing the black photoresist unit to cover the surface of the hole wall of the second hole region, the surface of the hole wall of the third hole region, and the surface of the hole wall of the fourth hole region includes:

Providing the black photoresist unit to cover the surface of the hole wall of the second hole region, the surface of the hole wall of the third hole region, and the surface of the hole wall of the fourth hole region by photolithography and annealing.

In detail, the black photoresist unit may be a BM (black matrix) unit. After dry etching to remove the inorganic materials of the second hole region, the third hole region, and the fourth hole region, a BM process is performed. The BM covers the surface of the hole wall of the second hole region, covers the surface of the hole wall of the third hole region, and covers the surface of the hole wall of the fourth hole region after a photolithography process and a patterning process to directly block lateral light leakage from the second hole region, the third hole region, and the fourth hole region. A precision of the lithography process is very high. A thickness of the BM is very small and occupied rare area of the hole regions. Utilization of aperture can be maximized, and the aperture can be narrower to increase a screen-to-body ratio. A border of the hole region needs no black glue to block light when attaching the CG (cover glass) layer. A border of the hole region is minimized, and the aperture is minimized.

Figure 4:
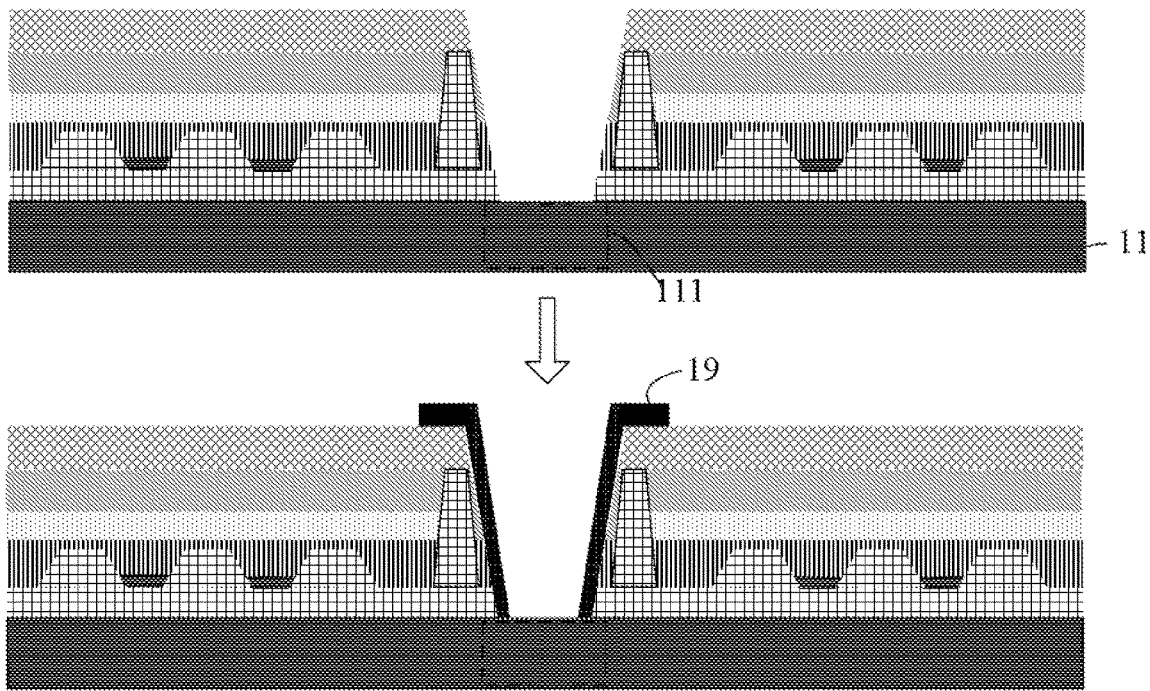
FIG. 4 is a technical schematic view of a process of covering with a black photoresist unit according to an embodiment of the present disclosure.

In detail, as shown in FIG. 4, a technical schematic view of a process of covering with a black photoresist unit, the etching process includes steps of:

Providing the black photoresist unit 19 to cover the surfaces of the holes wall and the traces of the second hole region, the third hole region, and the fourth hole region by photolithography and annealing to block light from the traces and hole walls.

In an embodiment, a thickness of a black photoresist ranges from 1.5 microns to 5 microns. The black photoresist unit has a function of isolating moisture and oxygen. A material of the black photoresist unit 19 can be a polymer material such as a polyimide, etc.

Figure 5:
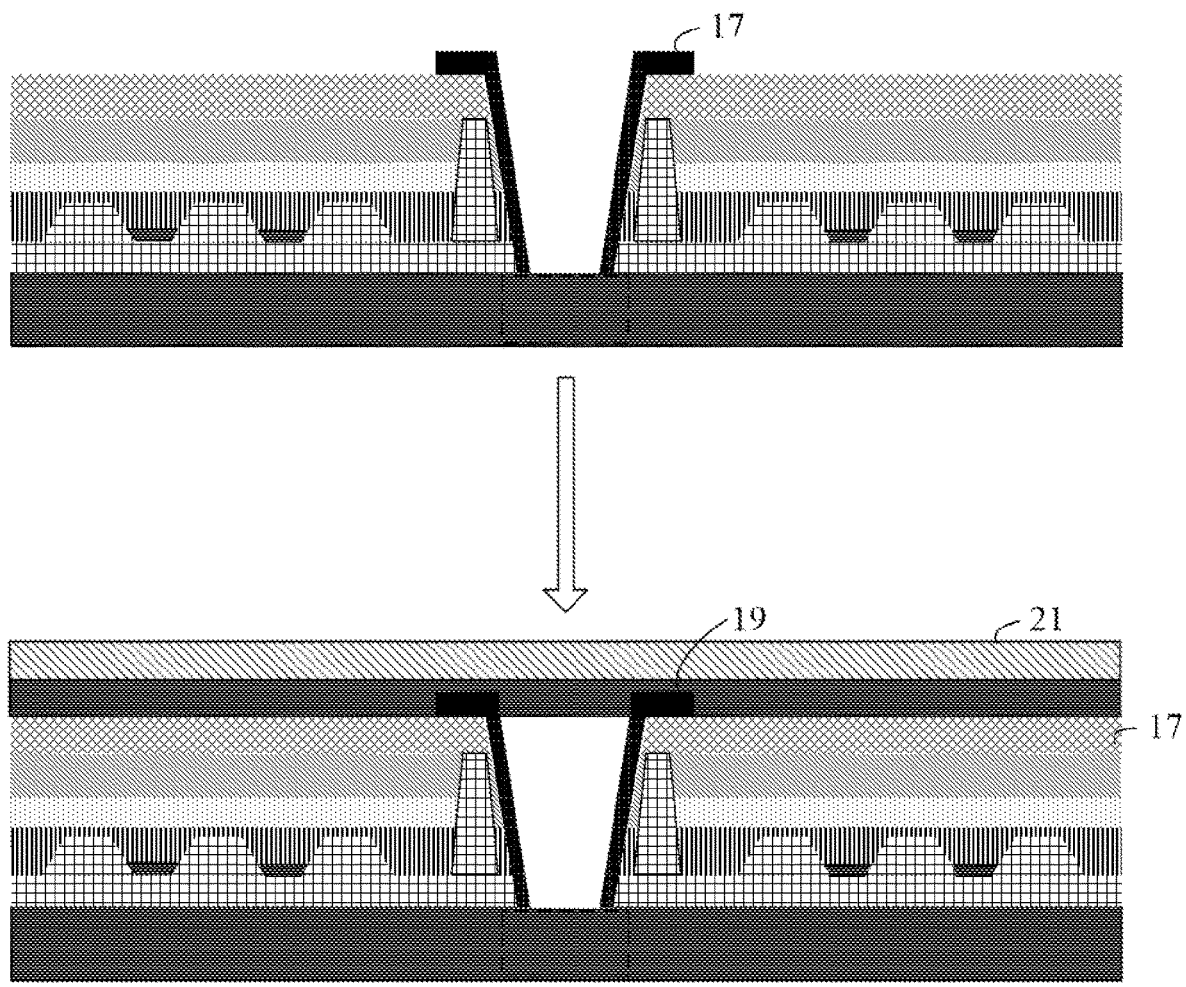
FIG. 5 is a technical schematic view of a process of providing a CG (cover glass) layer according to an embodiment of the present disclosure.

In an embodiment, as shown in the FIG. 5, a technical schematic view of a process of providing the CG layer, the process of providing the CG layer includes:

The glass cover is attached on the touch layer 17 by an OCA (optical clear adhesive) after etching and pattering the black photoresist unit 19 to form the CG layer 21 on the touch layer 17. An anti-cracking design of the hole regions can be omitted such as omitting the black glue of the hole regions of the CG layer 21 to reduce borders of the hole regions and minimize the aperture.

Further, a POL (polarizer) can be provided between the touch layer and the CG layer.

In an embodiment, the step of perforating the first hole region to form the perforation includes:

perforating the first hole region to form a perforation by a laser.

Figure 6:
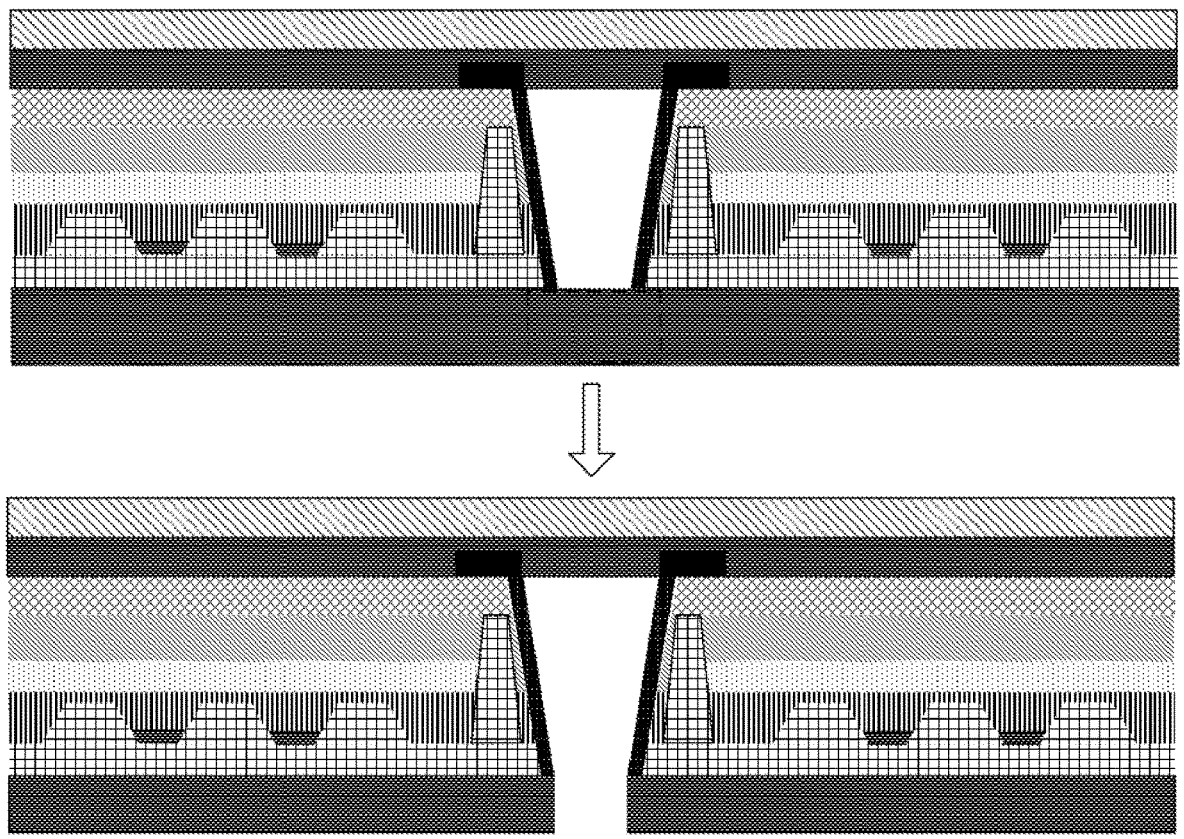
FIG. 6 is a technical schematic view of a process of perforating a first hole region according to an embodiment of the present disclosure.

In detail, as shown in FIG. 6, a technical schematic view of a process of perforating a first hole region, the process of perforating a first hole region includes:

After etching and removing the second hole region, the third hole region, and the fourth hole region and covering the material of the black photoresist unit, perforating the first hole region to form a perforation by a laser. A stress when perforating the first hole region can reduce to a great degree. An anti-cracking design of the hole regions can be omitted to further reduce a diameter of the aperture. A perforating process of the perforated display screen is done. The interference of the light leakage of the hole regions with the camera can be reduced.

In an embodiment, the disclosure provides steps of forming encapsulation layer on the array substrate layer. The following description is based on the manufacturing method of providing a encapsulation layer on the array substrate layer applying on the schematic structure of the perforated display screen in the FIG. 1. The method of providing a encapsulation layer on the array substrate layer includes steps of:

Depositing the first thin film layer 151 on the array substrate layer 13 by chemical vapor deposition.

Forming the organic layer 153 on the first thin film layer 151 by ink jet printing.

Depositing the second thin film layer 155 on the organic layer 153 by chemical vapor deposition. The first thin film layer 151, the IJP (ink jet printing) layer 153, and the second thin film layer 155 combine to form the encapsulation layer.

The first thin film layer 151 refers to a thin film layer formed by chemical reactions on a surface of a substrate using one or several gas phase compounds or substances containing thin film elements. The second thin film layer 155 refers to a thin film layer formed by chemical reactions on a surface of a substrate using one or several gas phase compounds or substances containing thin film elements.

In detail, the first thin film layer 151 is deposited on the array substrate layer 13 by chemical vapor deposition. The organic layer 153 is form on the first thin film layer 151 by ink jet printing. The second thin film layer 155 is deposited on the organic layer 153 by chemical vapor deposition. The first thin film layer 151, the organic layer 153, and the second thin film layer 155 combine to form the encapsulation layer 15.

Further, the touch layer 17 may be form directly on the encapsulation layer 15 to reduce a film width and then to reduce amount of light leakage after perforating.

In an embodiment, the disclosure further provides a display device includes the above perforated display screen.

The perforated display screen may be an OLED perforated display screen. The perforated display screen may include camera and a perforation corresponding to a port of the camera.

In detail, the method of manufacturing the perforated display screen includes steps of: providing a base substrate, and providing an array substrate layer on the base substrate, wherein the base substrate is provided with a first hole region, and the array substrate layer is provided with a second hole region; providing an encapsulation layer on the array substrate layer, wherein the encapsulation layer is provided with a third hole region; providing a touch layer on the encapsulation layer, wherein the touch layer is provided with a fourth hole region; etching the fourth hole region, the third hole region, and the second hole region in sequence; providing a black photoresist unit to cover a surface of a hole wall of the second hole region, a surface of a hole wall of the third hole region, and a surface of a hole wall of the fourth hole region; and perforating the first hole region to form a perforation. The disclosure provides the TP directly disposed on the array substrate layer to reduce a film thickness above a light emitting layer and then to reduce amount of light leakage after perforating. The disclosure etching an inorganic film layers of the second hole region, the third hole region, and the fourth hole region before perforating the first hole region of the PI layer to reduce stress to a great degree, an anti-cracking design of a hole region can be omitted to further reduce a diameter of a hole. The disclosure provides the black photoresist unit to cover a surface of a hole wall of the second hole region, a surface of a hole wall of the third hole region, and a surface of a hole wall of the fourth hole region to directly block lateral light leakage of the hole regions (the second hole region, the third hole region, and the fourth hole region) to reduce interference of the light leakage of the hole regions with the camera.

The technical features of the above-mentioned embodiments can be combined arbitrarily. In order to make the description concise, not all possible combinations of the various technical features in the above-mentioned embodiments are described. However, as long as there is no contradiction in the combination of these technical features, all of these combinations should be considered as the scope of this specification.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A perforated display screen, comprising:
a base substrate provided with a first hole region;
an array substrate layer disposed on the base substrate and provided with a second hole region;
an encapsulation layer disposed on the array substrate layer and provided with a third hole region;
a touch layer disposed on the encapsulation layer and provided with a fourth hole region, wherein the first hole region, the second hole region, the third hole region, and the fourth hole region are stacked in sequence, and the fourth hole region, the third hole region, and the second hole region are perforated in sequence; and
a black photoresist unit covering a surface of a hole wall of the second hole region, a surface of a hole wall of the third hole region, and a surface of a hole wall of the fourth hole region, wherein the first hole region is perforated to form a perforation.

2. The perforated display screen according to claim 1, further comprising a glass cover layer disposed on the touch layer after the black photoresist unit covers the touch layer.

3. The perforated display screen according to claim 1, wherein the array substrate layer comprises an array substrate and a light-emitting material layer, the array substrate is disposed on the base substrate, and the light-emitting material layer is disposed on the array substrate.

4. The perforated display screen according to claim 1, wherein a thickness of the black photoresist unit ranges from 1.5 microns to 5 microns.

5. The perforated display screen according to claim 1, wherein the encapsulation layer comprises a first thin film layer disposed on the array substrate layer, an organic layer disposed on the first thin film layer, and a second thin film layer disposed on the organic layer.

6. A method of manufacturing a perforated display screen, comprising steps of:
providing a base substrate, and providing an array substrate layer on the base substrate, wherein the base substrate is provided with a first hole region, and the array substrate layer is provided with a second hole region;
providing an encapsulation layer on the array substrate layer, wherein the encapsulation layer is provided with a third hole region;
providing a touch layer on the encapsulation layer, wherein the touch layer is provided with a fourth hole region, and the first hole region, the second hole region, the third hole region, and the fourth hole region are stacked in sequence;
etching the fourth hole region, the third hole region, and the second hole region in sequence;
providing a black photoresist unit to cover a surface of a hole wall of the second hole region, a surface of a hole wall of the third hole region, and a surface of a hole wall of the fourth hole region; and
perforating the first hole region to form a perforation.

7. The method of manufacturing the perforated display screen according to claim 6, wherein the step of etching the fourth hole region, the third hole region, and the second hole region in sequence further comprises:
etching the fourth hole region, the third hole region, and the second hole region in sequence by photolithography and dry etching.

8. The method of manufacturing the perforated display screen according to claim 6, wherein the step of providing the black photoresist unit to cover the surface of the hole wall of the second hole region, the surface of the hole wall of the third hole region, and the surface of the hole wall of the fourth hole region further comprises:
providing the black photoresist unit to cover the surface of the hole wall of the second hole region, the surface of the hole wall of the third hole region, and the surface of the hole wall of the fourth hole region by photolithography and annealing.

9. The method of manufacturing the perforated display screen according to claim 6, wherein the step of perforating the first hole region to form the perforation further comprises:

perforating the first hole region to form a perforation by a laser.

10. A display device, comprising a perforated display screen, wherein the perforated display screen comprises:
- a base substrate provided with a first hole region;
- an array substrate layer disposed on the base substrate and provided with a second hole region;
- an encapsulation layer disposed on the array substrate layer and provided with a third hole region;
- a touch layer disposed on the encapsulation layer and provided with a fourth hole region, wherein the first hole region, the second hole region, the third hole region, and the fourth hole region are stacked in sequence, and the fourth hole region, the third hole region, and the second hole region are perforated in sequence; and
- a black photoresist unit covering a surface of a hole wall of the second hole region, a surface of a hole wall of the third hole region, and a surface of a hole wall of the fourth hole region, wherein the first hole region is perforated to form a perforation.

11. The perforated display screen according to claim 10, further comprising a glass cover layer disposed on the touch layer after the black photoresist unit covers the touch layer.

12. The perforated display screen according to claim 10, wherein the array substrate layer comprises an array substrate and a light-emitting material layer, the array substrate is disposed on the base substrate, and the light-emitting material layer is disposed on the array substrate.

13. The perforated display screen according to claim 10, wherein a thickness of the black photoresist unit ranges from 1.5 microns to 5 microns.

14. The perforated display screen according to claim 10, wherein the encapsulation layer comprises a first thin film layer disposed on the array substrate layer, an organic layer disposed on the first thin film layer, and a second thin film layer disposed on the organic layer.

* * * * *